United States Patent [19]

Schaefer

[11] 3,982,190
[45] Sept. 21, 1976

[54] PHASELOCK CIRCUITRY WITH LOCK INDICATION

[75] Inventor: Dietrich H. Schaefer, Marion, Iowa

[73] Assignee: Rockwell International Corporation, El Segundo, Calif.

[22] Filed: July 31, 1975

[21] Appl. No.: 600,539

[52] U.S. Cl. ............................... 328/110; 328/155; 324/83 D; 331/25
[51] Int. Cl.² ........................................ H03B 3/04
[58] Field of Search .................... 328/109, 110, 155; 331/18, 25; 324/78 Z, 83 D, 83 FE; 84/454

[56] References Cited
UNITED STATES PATENTS

| 3,370,252 | 2/1968 | Zoerner | 331/25 |
|---|---|---|---|
| 3,386,096 | 5/1968 | Lundgreen | 324/83 D |
| 3,458,823 | 7/1969 | Nordahl | 328/110 X |
| 3,588,710 | 6/1971 | Masters | 328/155 X |
| 3,764,903 | 10/1973 | Griswold | 324/83 D |
| 3,795,169 | 3/1974 | Belcher | 84/454 |
| 3,921,095 | 11/1975 | Chu | 331/25 X |

*Primary Examiner*—John S. Heyman
*Attorney, Agent, or Firm*—Terry M. Blackwood; Robert J. Crawford

[57] ABSTRACT

Phaselock circuitry including phaselock loop means having an input signal and a feedback signal. Two signals $S_X$ and $S_Y$ are provided which are synchronous respectively with the input signal and the feedback signal. A decision circuit provides a lock or no-lock indication based on the degree of concurrence between $S_X$ and $S_Y$.

8 Claims, 8 Drawing Figures

PHASELOCK CIRCUITRY WITH LOCK INDICATION

The invention herein described was made in the course of or under a contract or subcontract thereunder with the Department of the Air Force.

This invention relates to electronic phaselock circuitry and to lock indication.

In determining and indicating whether a phaselock loop is in lock, it is quite common to employ apparatus known alternatively in the art as a "quadrature" or "auxiliary" phase detector, or also as a synchronous amplitude detector. Briefly, the auxiliary phase detector receives at one input the same input signal as the main phase detector, and receives at its other input a 90° phase shifted version of the loop VCO output signal. The auxiliary phase detector output signal is then smoothed by a low-pass filter and the filter output provides an indication of loop lock or no-lock. See Pages 52, and 53 of F. M. Gardner's book entitled Phaselock Techniques, John Wiley and Sons, Inc., 1966. The underlying principle is, of course, to develop an amplitude varying signal out of the filter whose amplitude varies from a low level, indicative of no-lock, to higher levels as the loop approaches lock. When the filter output signal reaches some predetermined level, loop lock is said to have been attained.

The above-described indicator suffers disadvantages in that it is slow to indicate lock and/or is susceptible to providing false indications of lock. More particularly, unless the phase detector output is suitably filtered, false indications of lock can occur if the loop bandwidth is quite narrow or if the signal-to-noise ratio of the input is poor. Thus, the auxiliary phase detector output is usually heavily filtered, which means that the time constant of the filter is long, and thus in operation the loop is locked sometime prior to the time the aforedescribed lock indicator indicates lock. This delay from actual lock to lock indication may be long, sometimes on the order of several seconds. Of course, when the time constant is reduced, false lock indications become considerably more probable.

In accordance with the present invention, phaselock circuitry including a lock, no-lock-indicator features rapid and reliable lock indication. This and other features, objects, and advantages of the invention will become more apparent upon reference to the following specification, claims, and appended drawings in which:

Figure 1:
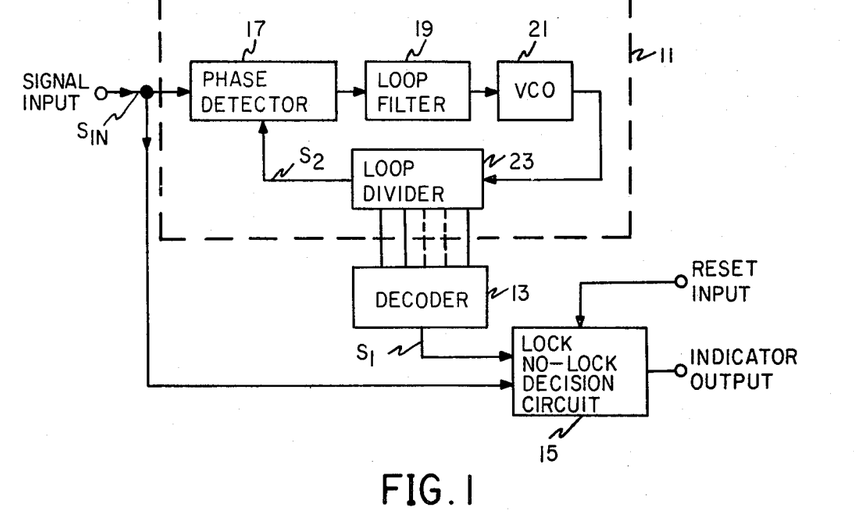
FIG. 1 is a block diagram schematic of the presently preferred embodiment of this invention.

The presently preferred embodiment, as represented in FIG. 1, comprises a phaselock loop 11, a decoder 13, and a decision circuit 15. Phaselock loop 11 comprises a phase detector 17, a loop filter 19, a voltage controlled oscillator (VCO) 21, and frequency divider 23. A loop input signal $S_{IN}$ along with variable frequency feedback signal $S_2$ enter phase detector 17 and produce a signal indicative of the phase difference between these two signals which after appropriate filtering, controls the VCO and thus the feedback. Loop divider 23 divides the VCO variable frequency output signal down to a frequency nominally the same as that of the input signal. Since phaselock loops and their principles of operation are well known and understood in the art, little more need be said here concerning phaselock loop 11. In the present application of the inventive principles herein, the particular implementation of phaselock loop 11 which is actually employed is further described and expanded on in patent application Ser. No. 591,542, filed June 30, 1975, entitled "Electronic Phaselock Circuitry" and assigned to the assignee of this invention. (See specifically FIG. 1 thereof.) The teachings of this referenced patent application are hereby incorporated by reference into the present disclosure for a more complete presentation.

The feedback path of phaselock loop 11 is tapped with decoder 13 to produce a pulse train signal $S_1$ which is synchronous with the feedback signal $S_2$. Signal $S_1$ and input signal $S_{IN}$ (which for the preferred embodiment is a 15 HZ pulse train as employed in TACAN) are then checked for time coincidence in decision circuit 15. (As will be described more fully hereinbelow, decoder 13 is implemented such that when phaselock loop 11 is locked, the individual pulses of $S_1$ coincide with, and preferably overlay, the individual pulses of $S_{IN}$.) Decision circuit 15 includes one or more counters appropriately connected such that, based on the degree of concurrence between $S_1$ and $S_{IN}$ (i.e., the number of instances of coincidence or noncoincidence), the decision circuit provides at its output an indication that the loop is either locked or is not locked. An externally generated reset signal appears at the RESET INPUT during power-up to ensure the appropriate initial conditions of the decision circuit.

Figure 2:
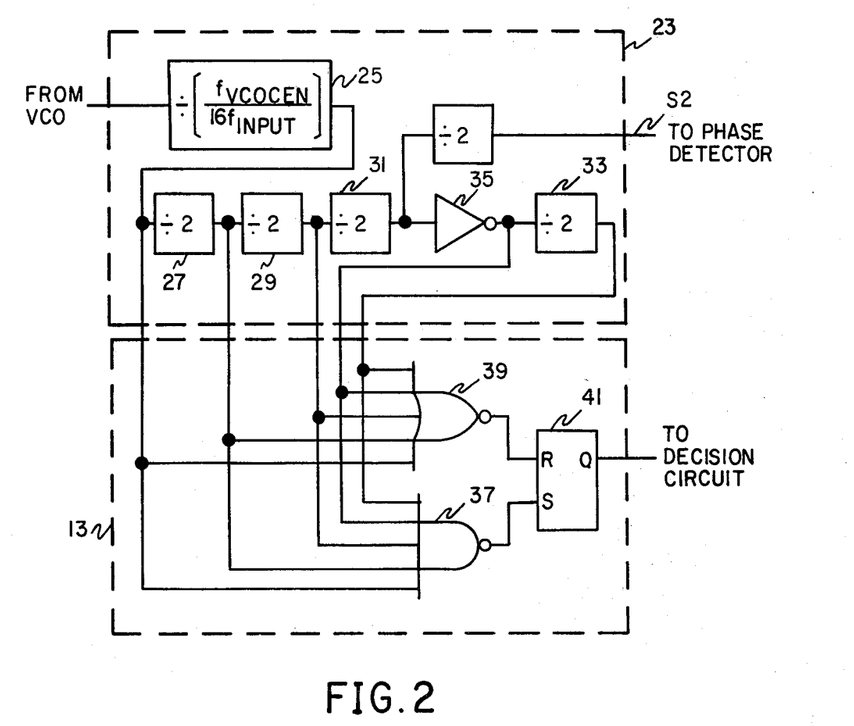
FIG. 2 is a more detailed schematic of a portion of the FIG. 1 circuitry.

Focusing attention now upon the decoder 13, the purpose thereof is to produce signal $S_1$ which comprises pulses of predetermined width and location occurring at the same frequency as the variable frequency feedback signal $S_2$. In a presently preferred application of the inventive principles herein, the width of each $S_1$ pulse, when the loop is locked, is 1/16 of a cycle of input signal $S_{IN}$; i.e., 22.5°. Moreover, each $S_1$ pulse, when the loop is tracking with 0° phase error, is time centered about an $S_{IN}$ pulse so as to extend ± 11.25° therearound. A decoder embodiment for providing such characteristics of $S_1$, and the associated loop divider embodiment, are shown in FIG. 2. Therein, the VCO output is divided down by 25, (a series of appropriately coupled negative edge triggered flip-flops) to a frequency nominally 16 times that of $S_{IN}$. The output of 25 is further divided down in increments of two by 27, 29, 31, and 33, each of which is also a negative edge triggered flip-flop. Inverter 35, located between 31 and 33, shifts the phase of the output of 31 by 180° and the phase of the output of 33 with respect to $S_2$ by 90°. Decoder 13 comprises a NAND gate 37 and a NOR gate 39, with inputs coupled to the loop divider 23 as shown, and a negative edge-triggered RS flip-flop 41, which is fed by the outputs of gates 37 and 39. It should be noted that in the preferred embodiment signal $S_2$ is phase shifted by 90° with respect to $S_{IN}$ when the loop is locked and thus, inverter 35 provides the 90° phase shift appropriate to collocate the $S_1$ and $S_{IN}$ pulses during loop-lock.

Of course, decoder 13 may be variously embodied and moreover may be tailored to produce practically any pulse width and or pulse location. For instance, two counters having different counting lengths could be fed with an appropriate submultiple of the VCO output. The counter outputs could then be combined in an exclusive-OR gate to produce $S_1$ pulses having practically any width and location characteristics.

As with decoder 13, decision circuit 15 may be variously embodied. Four present embodiments thereof are illustrated in FIGS. 3 through 6. As will become clearer hereinbelow, each embodiment will produce results similar to the others for some sequences of $S_{IN}$ pulses and for other sequences of $S_{IN}$ pulses each embodiment will produce results different from the other embodiments. In the decision circuit embodiment illustrated in FIG. 3, flip-flop 43 is a positive edge triggered D-type or delay flip-flop which, as is known in the art, transfers, at the occurrence of a positive edge of the signal at C, the information at D to the Q output. A low Q output indicates no-lock and a high Q output indicates lock. AND gates 45 and 47, and NOR gate 49 form a switch 50 controlled by flip-flop 43 such that when flip-flop 43 is indicating lock, $S_4$ is an inverted $S_1$, and when flip-flop 43 is indicating no-lock, $S_4$ is an inverted $S_3$. $S_3$ is the result of AND'ing $S_{IN}$ and $S_1$ in 51. Counter 53 is preferably a type 5490 counter widely available from several manufacturers such as Motorola, Signetics, and Texas Instruments to name a few. As seen in more detail in FIG. 7, counter 53 comprises three negative edge triggered JK flip-flops 55, 57, and 59, one negative edge triggered RS flip-flop 61, two NAND gates 63 and 65, and one AND gate 67.

Figure 3:
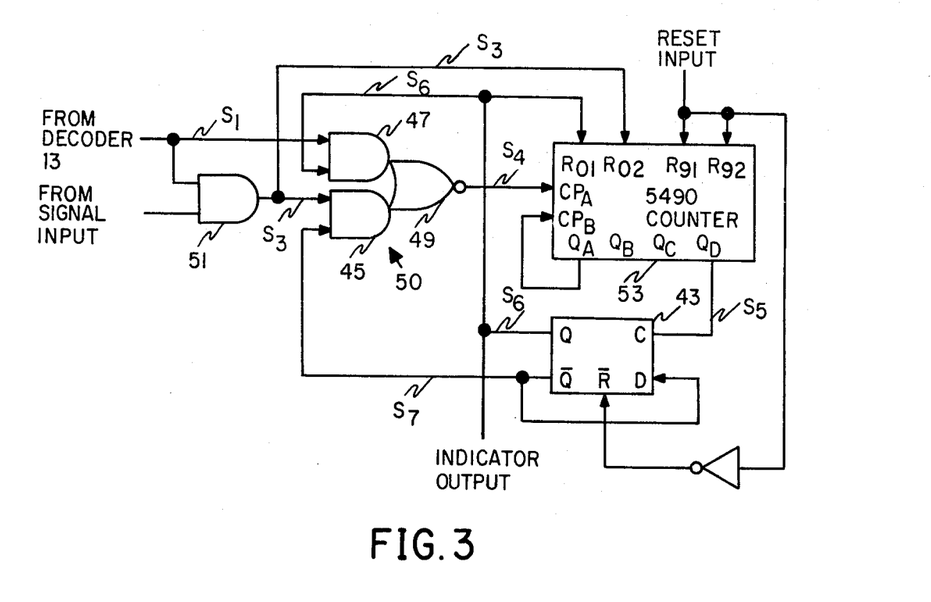
FIGS. 3 through 6 are more detailed schematics of alternative embodiments of another portion of the FIG. 1 circuitry.

When the counter is connected as shown in FIG. 3 and the outputs of the four flip-flops are sampled after each negative edge of $S_4$, a binary coded decimal (BCD) output, as shown in Table 1 below, is observed.

Table 1

| COUNT | OUTPUT $Q_D$ | OUTPUT $Q_C$ | OUTPUT $Q_B$ | OUTPUT $Q_A$ |
|---|---|---|---|---|
| 0 | 0 | 0 | 0 | 0 |
| 1 | 0 | 0 | 0 | 1 |
| 2 | 0 | 0 | 1 | 0 |
| 3 | 0 | 0 | 1 | 1 |
| 4 | 0 | 1 | 0 | 0 |
| 5 | 0 | 1 | 0 | 1 |
| 6 | 0 | 1 | 1 | 0 |
| 7 | 0 | 1 | 1 | 1 |
| 8 | 1 | 0 | 0 | 0 |
| 9 | 1 | 0 | 0 | 1 |
| 10 | 0 | 0 | 0 | 0 |

Figure 7:
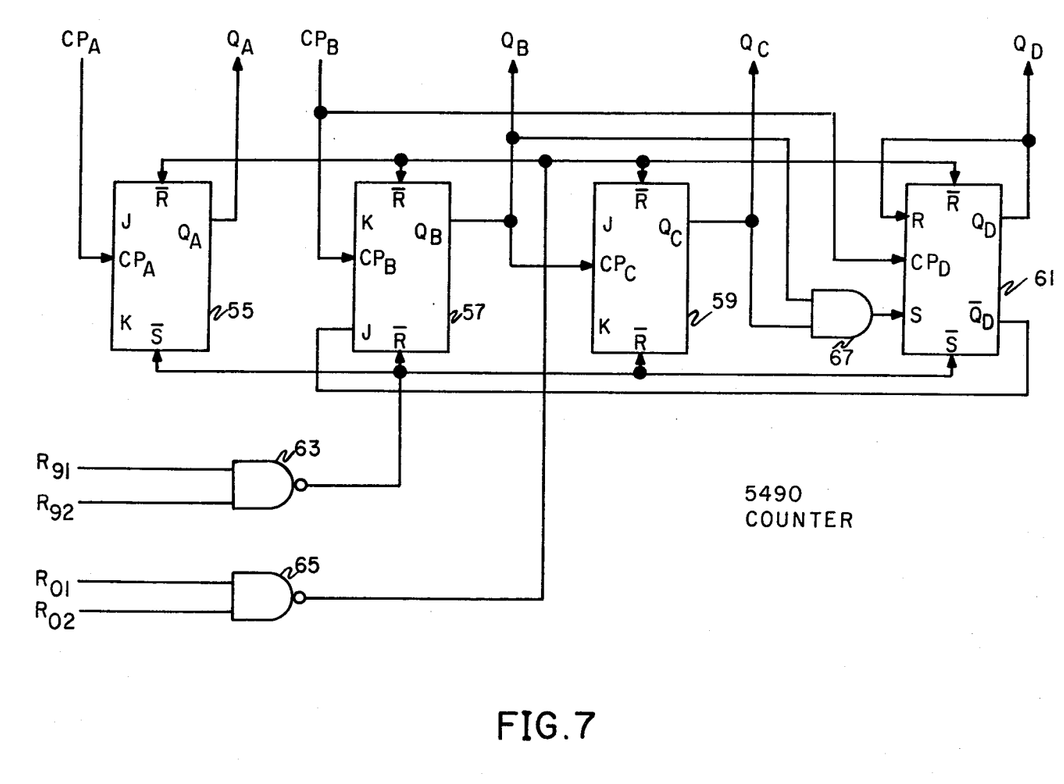
FIG. 7 is a more detailed schematic of a portion of the FIG. 3 circuitry.

Each flip-flop has an asynchronous reset connection, shown as $\bar{R}$ at the top edges. Flip-flops 55 and 61 have asynchronous set connections, shown as $\bar{S}$ at the bottom edges. Flip-flops 57 and 59 have a second asynchronous reset connection, shown as $\bar{R}$ at the bottom edges. If either R 91 or R 92 is low, or if both are low, such that the gate 63 output is high, and the two inputs R 01 and R 02 are both high, all four flip-flops are reset to the zero state. When the two inputs R 91 and R 92 are high, independent of the state of the two inputs R 01 and R 02, flip-flops 55 and 61 are set to the one state and flip-flops 57 and 59 are set to the zero state; i.e., the count is set to nine.

In describing the operation of the FIG. 3 embodiment, reference will be made to the waveforms of FIG. 8 which show the signals $S_1$ and $S_3$ through $S_6$ which are developed in response to two particular sequences of $S_{IN}$ pulses. $S_7$, not shown, is $S_6$ inverted. It should be noted that $S_{IN}$ for the TACAN application comprises a series of quite narrow pulses, each typically less than 185 μsec in width, which is equivalent to 1° for a 15 HZ pulse rate. As noted earlier, the $S_1$ pulses are substantially wider, each typically 22.5°. It is assumed for Example 1 that the loop is initially unlocked and that a reset pulse has appeared at the RESET INPUT thus setting the counter 53 to a count of nine, setting flip-flop 43 so that its Q output is low, and setting switch 50 so that an inverted $S_3$ is connected to the input of counter 53. In Example 1, at the first, second, and third illustrated $S_{IN}$ pulses, the loop has not yet locked and thus the $S_1$ pulses do not coincide with the $S_{IN}$ pulses and $S_3$ remains at a zero level. At the fourth $S_{IN}$ pulse, the VCO has adjusted sufficiently so that the $S_{IN}$ and $S_1$ pulses coincide and the first $S_3$ pulse appears. From this point onward in Example 1, $S_3$ duplicates $S_{IN}$ including the instances where an $S_{IN}$ pulse is missing due to input signal discontinuities or fade-out, provided lock is maintained. For each occurrence of an $S_3$ pulse, the corresponding $S_4$ pulse causes counter 53 to increment according to Table 1 above. That is, after the first $S_3$ pulse, the output of counter 53 will be set to a count of zero; after the second $S_3$ pulse, the counter 53 will be set to a count of one; etc. At the ninth $S_3$ pulse, the count of counter 53 goes to eight, and $S_5$ goes high which in turn causes $S_6$ to go high and indicate that the loop is locked. Also, with $S_6$ high (and thus $S_7$ low) switch 50 operates such that $S_4$ is now an inverted $S_1$ and counter 53 begins to count the negative edges of the new $S_4$. The first negative edge of the new $S_4$ advances counter 53 to a count of nine and $S_5$ remains high. However, at the first occurrence of an $S_3$ pulse following $s_6$ going high, all four counter flip-flops are reset to zero and $S_5$ goes low. $S_6$ remains high, indicating lock, since D flip-flop 43 is insensitive to the negative edge of $S_5$.

Figure 8:
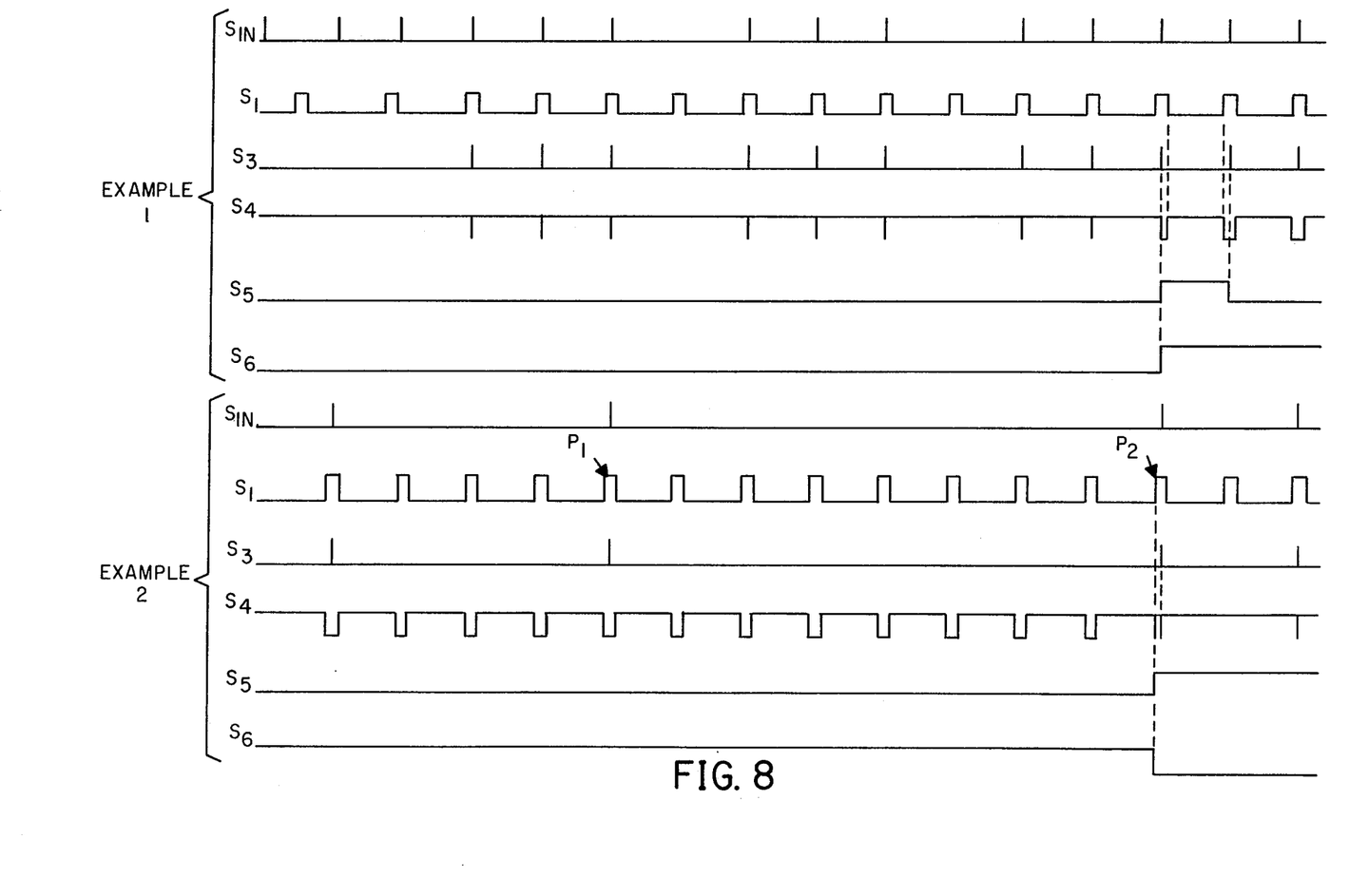
FIG. 8 shows waveforms useful in explaining the operation of the circuitry of FIG. 3.

Turning now to Example 2 in FIG. 8, it is assumed that the loop is initially locked and thus $S_6$ is high and $S_4$ is an inverted $S_1$. At each negative edge of $S_4$, the count of counter 53 is advanced by one but, since $S_6$ is high, at each occurrence of $S_3$ the counter is reset to zero. More particularly, at point $P_1$ in Example 2, the counter will be at a count of four. Shortly thereafter, at the occurrence of the next $S_3$ pulse, counter 53 is reset to zero. At point $P_2$, which is prior to the next occurrence of an $S_3$ pulse, the counter 53 will have reached the count of eight. Thus at point $P_2$, $S_5$ goes high which in turn causes $S_6$ to go low and indicate no-lock or loss of lock. Also, at $P_2$, $S_4$ again becomes an inverted $S_3$ and the counter begins to count $S_3$ pulses according to the afore described BCD sequence. Should no reset pulse occur at the RESET INPUT, the counter would count nine, zero, one, etc. for occurrences of $S_3$ pulses until the count of eight were again reached at which time lock would again be indicated. In this case, ten counts are required before lock is indicated. In reality, and as illustrated in FIG. 8, the loop may still be locked at point $P_2$, but the number of occurrences of $S_{IN}$ pulses is so low as to be unreliable and thus it is desirable to indicate loss of lock.

It should be pointed out that the number M of $S_3$ pulses occurring before lock is indicated, is a function of the certainty desired that the loop is indeed locked. Similarly, the number N of consecutively missing $S_3$ pulses before no-lock is indicated is a function of the certainty desired that once the loop is locked, the loop remains locked and/or the input signal remains a reliable one. In the FIG. 3 embodiment, M and N are respectively 9 and 7. However, by placing an appropriate decoder between the $Q_A$, $Q_B$, $Q_C$, and $Q_D$ outputs of counter 53 and the C input of D flip-flop 43, other values of M and N can be achieved. Also, by replacing the 5490 counter with a counter containing more flip-flops, but which is reset similarly, and also using a decoder to derive the input to D flip-flop 43, an even greater variety of M and N may be achieved.

It should also be pointed out that the FIG. 3 embodiment may, in rare instances, provide a brief indication of loop lock when actually the loop is not locked. As seen above, when going from a no-lock to a lock condition, any missing $S_3$ pulses are merely ignored and the counter merely stops counting and holds its accumulated count until the next $S_3$ pulse occurs. This means that, regardless of the time separation between $S_3$ pulses, and whether or not the $S_3$ occurrences are purely random, when nine $S_3$ pulses occur, counter 53 will advance to a count of eight and D flip-flop 43 will indicate (by $S_6$ going high) that the loop is locked.

Figure 4:
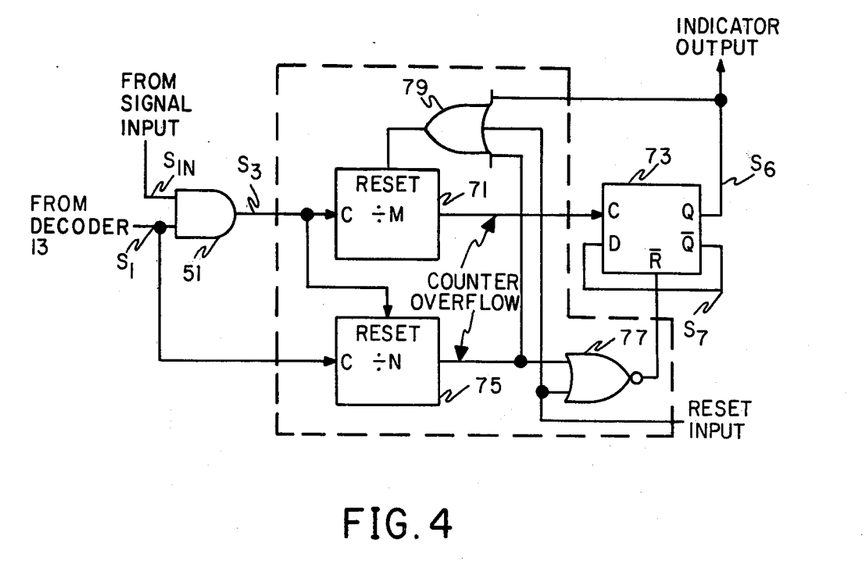

The decision circuit embodiment shown in FIG. 4 precludes such an event. Otherwise, the FIG. 4 embodiment provides results which are similar to the embodiment of FIG. 3. More particularly, and referring to FIG. 4, when the loop is initially unlocked and a pulse has appeared at RESET INPUT to reset counter 71 and flip-flop 73 to zero states, counter 71 then begins to count $S_3$ pulses and advance accordingly. Counter 75 advances one count in response to each $S_1$ pulse but then is almost immediately reset to zero if an $S_3$ pulse occurs. When counter 71 advances to a count of M, its output goes high and causes the flip-flop 73 Q output $S_6$ to go high and indicate lock. With $S_6$ high, counter 71 is reset to a zero count and while $S_6$ remains high, is inhibited from counting. Now if $S_3$ pulses begin disappearing, counter 75 advances without being reset and if (N-1) consecutive $S_3$ pulses fail to appear, counter 75 output goes high at the N th $S_1$ pulse, provides a command to the R input of flip-flop 73 via NOR gate 77 and causes $S_6$ to go low and indicate loss of lock.

Note, however, that the output of counter 75 is also connected via OR gate 79 to the counter 71 reset. Thus assuming the loop is initially unlocked and counter 71 begins to advance in response to $S_3$ pulses, if (N-1) consecutive $S_3$ pulses fail to appear, counter 75 output will go high at the N th $S_1$ pulse and will reset counter 71 to a count of zero. Thus counter 71 must start all over every time (N-1) consecutive $S_3$ pulses fail to appear.

In both the decision circuit embodiments above described, missing $S_3$ pulses are ignored at least to some degree in the transition period from no-lock to lock. In the FIG. 3 embodiment missing $S_3$ pulses are ignored altogether and in the FIG. 4 embodiment missing $S_3$ pulses are ignored unless a predetermined consecutive number of $S_3$ pulses are missing. In the decision circuit embodiments of FIGS. 5 and 6, the "value" of a noncoincidence between $S_{IN}$ and $S_1$, while going from no-lock, is more heavily "weighted". That is, in the FIG. 5 embodiment, noncoincidences are in effect, subtracted from the coincidences. In the FIG. 6 embodiment, any instance of noncoincidence prior to attaining the final desired count, causes the count to start over again at zero; thus only a predetermined number of consecutive coincidences between $S_1$ and $S_{IN}$ will provide a lock indication.

Figure 5:
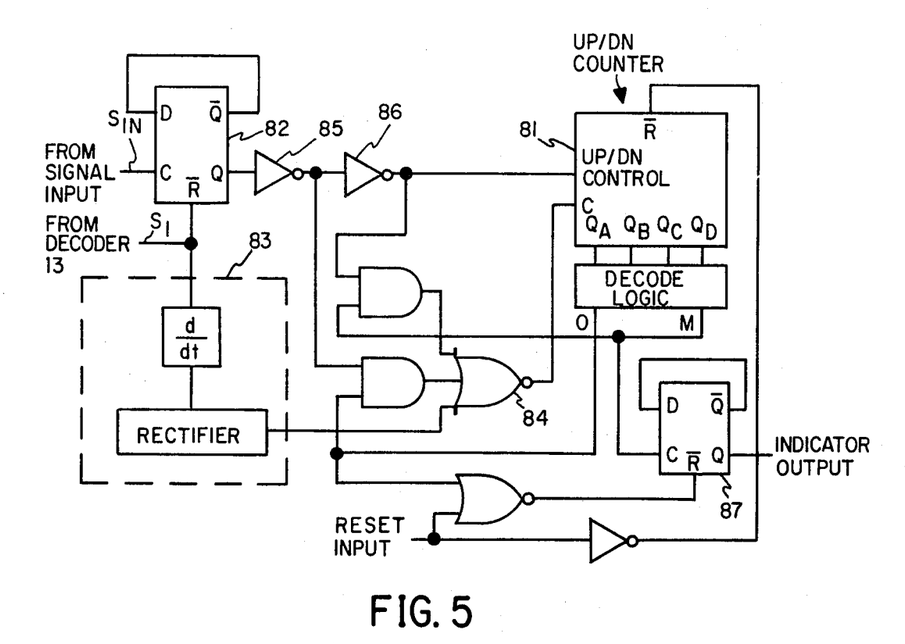

More particularly, and referring now to FIG. 5, counter 81 is any UP/DOWN counter having a separate UP/DOWN control line and a clock input (i.e., C). The counter length may be any desired length. The UP/DOWN control line controlled by D type flip-flop 82 is placed in the UP mode only if input signal $S_{IN}$ rises during the time signal $S_1$ is high. As soon as $S_1$ goes low, the counter control line is again placed in the DOWN mode and thus, an UP count can only be attained whenever signal $S_{IN}$ occurs during the time signal $S_1$ is high. Signal $S_1$, differentiated and rectified with differentiator and rectifier circuitry 83 such that a narrow pulse is created at the trailing edge of signal $S_1$, is used to provide the counter clock. This clock signal is connected to the UP/DOWN counter via NOR gate 84. If an $S_{IN}$ pulse occurs, coincident with $S_1$, the control is set to the UP mode and then, since the clock signal for the counter is the trailing edge of $S_1$, the counter advances by one as soon as the trailing edge of $S_1$ passes. Since the trailing edge of $S_1$ also sets the UP/DOWN control line to the DOWN mode, appropriate control line delay is provided by inverters 85 and 86 to ensure that the UP mode still exists at the time the UP/DOWN counter clock occurs. If an $S_{IN}$ pulse is missing or falls outside the $S_1$ pulse, the counter control remains in the DOWN mode and the counter decreases by one as soon as the trailing edge of $S_1$ passes. In order to indicate lock, the proper counter number (i.e., M) is decoded and used to set a D type flip-flop 87 to the lock state. This same decoded signal is used to prevent counter advance beyond the desired number M during UP counts. In order to indicate no-lock, the number zero is decoded and used to reset flip-flop 87 to the no-lock state as the counter comes down from the lock indication. This zero decode signal is also used to prevent a counter DOWN count beyond zero.

It should be apparent that, similarly to the FIGS. 3 and 4 embodiments, the decision circuit of FIG. 5 will indicate lock after each of some predetermined number M of consecutive $S_1$ pulses has been coincident with an $S_{IN}$ pulse. In addition, however, the FIG. 5 embodiment will also indicate lock after the number of instances of coincidence between an $S_1$ pulse and an $S_{IN}$ pulse becomes greater than the number of instances of noncoincidence between an $S_1$ pulse and an $S_{IN}$ pulse by the number M. This same scheme of weighting is also true of the transition from lock to no-lock. That is, although M consecutive noncoincidences will cause a no-lock indication, if the number of noncoincidences exceeds by M, the number of coincidences, no-lock will also be indicated. Thus, this embodiment may be analogized to a true integrator. Also, in the FIG. 5 embodiment, the number of counts going from a lock to a no-lock condition (i.e., N) is the same as the number of counts going from a no-lock to a lock condition (i.e., M). One modification of FIG. 5 so that M $\neq$ N is to (i) use a presettable UP/DOWN counter that is preset to the number N using a preset control circuit to generate the number N, (ii) use the no-lock to lock transition output of flip-flop 87 to preset counter 81 to the number N and (iii) decode the number N and use this output to prevent further UP counts.

Figure 6:
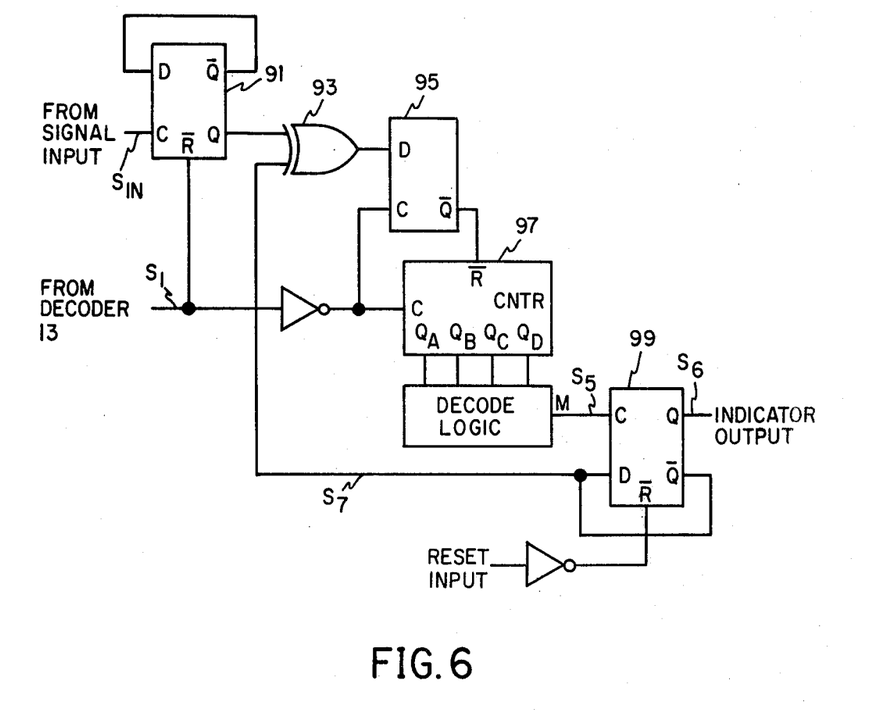

Referring now to FIG. 6, therein is shown a decision circuit requiring M consecutive coincidences between $S_{IN}$ and $S_1$ before lock is indicated. Flip-flop 91 is set to a one whenever an $S_{IN}$ pulse, coincident with an $S_1$ pulse, occurs, and remains a one until the $S_1$ pulse disappears. This signal is combined with the lock indication in the exclusive-OR gate 93 which provides a logic one output just prior to the time the gate disappears if flip-flop 91 output and the lock indication disagree. If these two signals agree, the output of the exclusive-OR is a zero. This momentary information is latched into flip-flop 95 to provide a constant output for the counter 97 reset. Thus the counter 97 is reset whenever the lock indicator and flip-flop 91 output agree and is allowed to count whenever these two signals disagree. The counter output is decoded to obtain a clock pulse for the lock indicator flip-flop 99. The length of the counter and the decode logic depend on the number of coincident events desired. With this decision circuit, lock is indicated only after each of M consecutive $S_1$ pulses has been coincident with an $S_{IN}$ pulse. Also, once lock is indicated and assuming no external reset occurs, an out-of-lock indication is obtained only after each of M consecutive $S_1$ pulses has been noncoincident with an $S_{IN}$ pulse.

It should be apparent that in the FIGS. 5 and 6 embodiments, flip-flops 82 and 91 respectively are employed to determine any coincidence between $S_1$ and $S_{IN}$ pulses, whereas in the FIGS. 3 and 4 embodiments, AND gate 51 performs this function.

One further modification should be pointed out. Hereinabove, it is assumed that $S_{IN}$ is already in a usable pulse form and requires no modification between the SIGNAL INPUT and AND gate 51 input. However, other forms of $S_{IN}$ may be employed so long as an appropriate pulse train (e.g., an $S_{IN}'$) synchronous with the true $S_{IN}$ appears at the AND gate 51 input. Proper wave-shaping may be employed to produce such a synchronous pulse train and one which is analogous to that hereinabove described for the TACAN $S_{IN}$. For instance, if $S_{IN}$ were sinusoidal, a limiter, differentiator, and rectifier serially connected in the stated order between the SIGNAL INPUT and the AND gate 51 input would produce a pulse train $S_{IN}'$ synchronous with the sinusoidal $S_{IN}$ and compatible with the various decision circuits.

Thus, while various embodiments of the present invention have been shown and described, it is apparent that changes and modifications may be made therein without departing from the invention in its broader aspects. The aim of the appended claims, therefore, is to cover all such changes and modifications as fall within the true spirit and scope of the invention.

What is claimed is:

1. Phaselock circuitry comprising:
   phaselock loop first means including means for receiving an input signal and a feedback signal of variable frequency and providing an output signal indicative of the phase difference between said signals, said feedback signal being provided by means including controllable oscillator means,
   second means for providing a pulse train signal $S_X$ synchronous with said input signal,
   third means for providing a pulse train signal $S_Y$ synchronous with said feedback signal,
   decision circuit fourth means receiving $S_X$ and $S_Y$ as inputs and including coincidence determination means and counting means, said fourth means providing an output signal having a first state indicative of a lock condition or a second state indicative of a no-lock condition, whereby, said fourth means output signal state depends on the degree of concurrence between $S_X$ and $S_Y$,
   said input signal being a pulse train signal and $S_X$ being the same signal as said input signal.

2. Phaselock circuitry comprising:
   phaselock loop first means including means for receiving an input signal and a feedback signal of variable frequency and providing an output signal indicative of the phase difference between said signals, said feedback signal being provided by means including controllable oscillator means,
   second means for providing a pulse train signal $S_X$ synchronous with said input signal,
   third means for providing a pulse train signal $S_Y$ synchronous with said feedback signal,
   decision circuit fourth means receiving $S_X$ and $S_Y$ as inputs and including coincidence determination means and counting means, said fourth means providing an output signal having a first state indicative of a lock condition or a second state indicative of a no-lock condition, whereby, said fourth means output signal state depends on the degree of concurrence between $S_X$ and $S_Y$,
   said first means including frequency dividing means and said third means including decoder means connected to said frequency dividing means.

3. Phaselock circuitry comprising:
   phaselock loop first means including means for receiving an input signal and a feedback signal of variable frequency and providing an output signal indicative of the phase difference between said signals, said feedback signal being provided by means including controllable oscillator means,
   second means for providing a pulse train signal $S_X$ synchronous with said input signal,
   third means for providing a pulse train signal $S_Y$ synchronous with said feedback signal,
   decision circuit fourth means receiving $S_X$ and $S_Y$ as inputs and including coincidence determination means and counting means, said fourth means providing an output signal having a first state indicative of a lock condition or a second state indicative of a no-lock condition, whereby, said fourth means output signal state depends on the degree of concurrence between $S_X$ and $S_Y$,
   said fourth means being resettable with an external command to an output of said second state.

4. Phaselock circuitry comprising:
   phaselock loop first means including means for receiving an input signal and a feedback signal of variable frequency and providing an output signal indicative of the phase difference between said signals, said feedback signal being provided by means including controllable oscillator means,
   second means for providing a pulse train signal $S_X$ synchronous with said input signal,
   third means for providing a pulse train signal $S_Y$ synchronous with said feedback signal,
   decision circuit fourth means receiving $S_X$ and $S_Y$ as inputs and including coincidence determination means and counting means, said fourth means providing an output signal having a first state indicative of a lock condition or a second state indicative of a no-lock condition, said fourth means output changing from said second state to said first state after each of U consecutive $S_Y$ pulses has been coincident with an $S_X$ pulse, and said fourth means output changing from said first state to said second state after each of V consecutive $S_Y$ pulses has been noncoincident with an $S_X$ pulse, where U and V are predetermined numbers, whereby, said fourth means output signal state depends on the degree of concurrence between $S_X$ and $S_Y$.

5. Circuitry as defined in claim 4 wherein said fourth means output changes from said second state to said first state also after each of U nonconsecutive $S_Y$ pulses has been coincident with an $S_X$ pulse.

6. Circuitry as defined in claim 3 wherein said fourth means output changes from said second state to said first state also after the number of instances of coincidence between an $S_Y$ pulse and an $S_X$ pulse becomes greater than the number of instances of noncoincidence between an $S_Y$ pulse and an $S_X$ pulse by the number U.

7. Circuitry as defined in claim 4 wherein said fourth means output changes from said second state to said first state also after each of U nonconsecutive $S_Y$ pulses has been coincident with an $S_X$ pulse provided that between any two succeeding instances of coincidence less than V consecutive $S_Y$ pulses have been noncoincident with an $S_X$ pulse.

8. Circuitry as defined in claim 4 wherein said fourth means output changes from said second state to said first state only after each of U consecutive $S_Y$ pulses has been coincident with an $S_X$ pulse.

* * * * *

UNITED STATES PATENT OFFICE
CERTIFICATE OF CORRECTION

PATENT NO. : 3,982,190
DATED : September 21, 1976
INVENTOR(S) : Dietrich H. Schaefer It is certified that error appears in the above-identified patent and that said Letters Patent are hereby corrected as shown below:

Column 5, Lines 60 and 61, after the word "no-lock" insert --to lock--.

Column 9, Line 8, delete "3" and substitute therefor --4--.

Signed and Sealed this

Thirtieth Day of November 1976

[SEAL]

Attest:

RUTH C. MASON
Attesting Officer

C. MARSHALL DANN
Commissioner of Patents and Trademarks